United States Patent
Zheng et al.

(10) Patent No.: US 8,089,132 B2
(45) Date of Patent: Jan. 3, 2012

(54) MAGNETIC MEMORY WITH PHONON GLASS ELECTRON CRYSTAL MATERIAL

(75) Inventors: Yuankai Zheng, Bloomington, MN (US); Haiwen Xi, Prior Lake, MN (US); Dimitar V. Dimitrov, Edina, MN (US); Dexin Wang, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 244 days.

(21) Appl. No.: 12/423,119

(22) Filed: Apr. 14, 2009

(65) Prior Publication Data

US 2010/0091563 A1 Apr. 15, 2010

Related U.S. Application Data

(60) Provisional application No. 61/104,078, filed on Oct. 9, 2008.

(51) Int. Cl.
*G11C 11/02* (2006.01)

(52) U.S. Cl. ........... 257/421; 257/427; 257/E27.006; 365/158

(58) Field of Classification Search ........... 257/421, 257/422, 427, E27.006; 365/158
See application file for complete search history.

(56) References Cited

U.S. PATENT DOCUMENTS

| | | | |
|---|---|---|---|
| 4,733,371 A | 3/1988 | Terada |
| 5,191,223 A | 3/1993 | Munekata |
| 5,646,419 A | 7/1997 | McCaldin |
| 5,673,225 A | 9/1997 | Jeong |
| 5,761,115 A | 6/1998 | Kozicki |
| 5,920,446 A | 7/1999 | Gill |
| 5,982,670 A | 11/1999 | Yamashita |
| 6,072,718 A | 6/2000 | Abraham |
| 6,178,136 B1 | 1/2001 | Lin |
| 6,226,197 B1 | 5/2001 | Nishimura |
| 6,252,796 B1 | 6/2001 | Lenssen |
| 6,381,106 B1 | 4/2002 | Pinarbasi |
| 6,469,926 B1 | 10/2002 | Chen |
| 6,532,164 B2 | 3/2003 | Redon |
| 6,542,000 B1 | 4/2003 | Black |
| 6,569,745 B2 | 5/2003 | Hsu |
| 6,584,016 B2 | 6/2003 | Park |

(Continued)

FOREIGN PATENT DOCUMENTS

GB 2 422 735 8/2006

(Continued)

OTHER PUBLICATIONS

Baek et al., Tech. Dig. IEDM (20304) 587.

(Continued)

*Primary Examiner* — Anh Phung
*Assistant Examiner* — Michael Lulis
(74) *Attorney, Agent, or Firm* — Mueting Raasch & Gebhardt PA

(57) ABSTRACT

A magnetic memory unit includes a tunneling barrier separating a free magnetic element and a reference magnetic element. A first phonon glass electron crystal layer is disposed on a side opposing the tunneling barrier of either the free magnetic element or the reference magnetic element. A second phonon glass electron crystal layer also be disposed on a side opposing the tunneling barrier of either the free magnetic element or the reference magnetic element to provide a Peltier effect on the free magnetic element and the reference magnetic element.

19 Claims, 2 Drawing Sheets

U.S. PATENT DOCUMENTS

| | | | |
|---|---|---|---|
| 6,602,677 | B1 | 8/2003 | Wood |
| 6,633,498 | B1 | 10/2003 | Engel |
| 6,639,830 | B1 | 10/2003 | Heide |
| 6,643,168 | B2 | 11/2003 | Okazawa |
| 6,700,753 | B2 | 3/2004 | Singleton |
| 6,703,645 | B2 | 3/2004 | Ohno |
| 6,711,051 | B1 | 3/2004 | Poplevine |
| 6,711,067 | B1 | 3/2004 | Kablanian |
| 6,714,444 | B2 | 3/2004 | Huai |
| 6,741,492 | B2 | 5/2004 | Nii |
| 6,744,086 | B2 | 6/2004 | Daughton |
| 6,759,263 | B2 | 7/2004 | Ying |
| 6,765,819 | B1 | 7/2004 | Bhattacharyya |
| 6,774,391 | B1 | 8/2004 | Cowburn |
| 6,781,867 | B2 | 8/2004 | Kurth |
| 6,781,871 | B2 | 8/2004 | Park |
| 6,801,415 | B2 | 10/2004 | Slaughter |
| 6,818,961 | B1 | 11/2004 | Rizzo |
| 6,829,161 | B2 | 12/2004 | Huai |
| 6,831,312 | B2 | 12/2004 | Slaughter |
| 6,834,005 | B1 | 12/2004 | Parkin |
| 6,835,423 | B2 | 12/2004 | Chen |
| 6,838,740 | B2 | 1/2005 | Huai |
| 6,842,368 | B2 | 1/2005 | Hayakawa |
| 6,845,038 | B1 | 1/2005 | Shukh |
| 6,847,547 | B2 | 1/2005 | Albert |
| 6,850,433 | B2 | 2/2005 | Sharma |
| 6,864,551 | B2 | 3/2005 | Tsang |
| 6,888,709 | B2 | 5/2005 | Princinsky |
| 6,888,742 | B1 | 5/2005 | Nguyen |
| 6,909,633 | B2 | 6/2005 | Tsang |
| 6,914,807 | B2 | 7/2005 | Nakamura |
| 6,920,063 | B2 | 7/2005 | Huai |
| 6,933,155 | B2 | 8/2005 | Albert |
| 6,943,040 | B2 | 9/2005 | Min |
| 6,950,335 | B2 | 9/2005 | Dieny |
| 6,958,927 | B1 | 10/2005 | Nguyen |
| 6,963,500 | B2 | 11/2005 | Tsang |
| 6,965,522 | B2 | 11/2005 | Lung |
| 6,967,863 | B2 | 11/2005 | Huai |
| 6,979,586 | B2 | 12/2005 | Guo |
| 6,985,378 | B2 | 1/2006 | Kozicki |
| 6,985,385 | B2 | 1/2006 | Nguyen |
| 6,992,359 | B2 | 1/2006 | Nguyen |
| 6,998,150 | B2 | 2/2006 | Li |
| 7,009,877 | B1 | 3/2006 | Huai |
| 7,020,024 | B2 | 3/2006 | Sim |
| 7,057,921 | B2 | 6/2006 | Valet |
| 7,067,330 | B2 | 6/2006 | Min |
| 7,088,609 | B2 | 8/2006 | Valet |
| 7,088,624 | B2 | 8/2006 | Daniel |
| 7,092,279 | B1 | 8/2006 | Sheppard |
| 7,093,347 | B2 | 8/2006 | Nowak |
| 7,098,494 | B2 | 8/2006 | Pakala |
| 7,098,495 | B2 | 8/2006 | Sun |
| 7,099,186 | B1 | 8/2006 | Braun |
| 7,105,372 | B2 | 9/2006 | Min |
| 7,110,284 | B2 | 9/2006 | Hayakawa |
| 7,110,287 | B2 | 9/2006 | Huai |
| 7,126,202 | B2 | 10/2006 | Huai |
| 7,138,648 | B2 | 11/2006 | Kneissl |
| 7,161,829 | B2 | 1/2007 | Huai |
| 7,187,577 | B1 | 3/2007 | Wang |
| 7,189,435 | B2 | 3/2007 | Tuominen |
| 7,190,611 | B2 | 3/2007 | Nguyen |
| 7,196,882 | B2 | 3/2007 | Deak |
| 7,224,601 | B2 | 5/2007 | Panchula |
| 7,230,265 | B2 | 6/2007 | Kaiser |
| 7,230,845 | B1 | 6/2007 | Wang |
| 7,233,039 | B2 | 6/2007 | Huai |
| 7,241,631 | B2 | 7/2007 | Huai |
| 7,241,632 | B2 | 7/2007 | Vang |
| 7,242,048 | B2 | 7/2007 | Huai |
| 7,242,631 | B2 | 7/2007 | Fujioka |
| 7,245,462 | B2 | 7/2007 | Huai |
| 7,272,034 | B1 | 9/2007 | Chen |
| 7,272,035 | B1 | 9/2007 | Chen |
| 7,274,057 | B2 | 9/2007 | Worledge |
| 7,282,755 | B2 | 10/2007 | Pakala |
| 7,285,836 | B2 | 10/2007 | Ju |
| 7,286,395 | B2 | 10/2007 | Chen |
| 7,289,356 | B2 | 10/2007 | Diao |
| 7,345,912 | B2 | 3/2008 | Luo |
| 7,369,427 | B2 | 5/2008 | Diao |
| 7,379,327 | B2 | 5/2008 | Chen |
| 7,385,842 | B2 | 6/2008 | Deak |
| 7,403,418 | B2 | 7/2008 | Lin |
| 7,408,806 | B2 | 8/2008 | Park |
| 7,411,815 | B2 | 8/2008 | Gogl |
| 7,430,135 | B2 | 9/2008 | Huai |
| 7,477,491 | B2 | 1/2009 | Li |
| 7,480,173 | B2 | 1/2009 | Guo |
| 7,480,175 | B2 * | 1/2009 | Dieny et al. ............... 365/171 |
| 7,485,503 | B2 | 2/2009 | Brask |
| 7,486,551 | B1 | 2/2009 | Li |
| 7,486,552 | B2 | 2/2009 | Apalkov |
| 7,489,541 | B2 | 2/2009 | Pakala |
| 7,495,867 | B2 | 2/2009 | Sbiaa |
| 7,502,249 | B1 | 3/2009 | Ding |
| 7,515,457 | B2 | 4/2009 | Chen |
| 7,518,835 | B2 | 4/2009 | Huai |
| 7,539,047 | B2 | 5/2009 | Katti |
| 7,556,869 | B2 * | 7/2009 | Fukushima et al. ......... 428/816 |
| 7,572,645 | B2 | 8/2009 | Sun |
| 7,573,736 | B2 | 8/2009 | Wang |
| 7,576,956 | B2 | 8/2009 | Huai |
| 7,728,622 | B2 | 6/2010 | Chua-Eoan et al. |
| 7,764,537 | B2 | 7/2010 | Jung |
| 2003/0011945 | A1 | 1/2003 | Yuasa |
| 2003/0137864 | A1 | 7/2003 | Holden |
| 2004/0008537 | A1 | 1/2004 | Sharma |
| 2004/0084702 | A1 | 5/2004 | Jeong |
| 2004/0090809 | A1 | 5/2004 | Tran |
| 2004/0170055 | A1 | 9/2004 | Albert |
| 2004/0179311 | A1 | 9/2004 | Li |
| 2004/0197579 | A1 | 10/2004 | Chen |
| 2005/0048674 | A1 | 3/2005 | Shi |
| 2005/0068684 | A1 | 3/2005 | Gill |
| 2005/0117391 | A1 | 6/2005 | Yoda |
| 2005/0139883 | A1 | 6/2005 | Sharma |
| 2005/0150535 | A1 | 7/2005 | Samavedam |
| 2005/0150537 | A1 | 7/2005 | Ghoshal |
| 2005/0184839 | A1 | 8/2005 | Nguyen |
| 2005/0185459 | A1 | 8/2005 | Fukuzumi |
| 2005/0237787 | A1 | 10/2005 | Huai |
| 2005/0254286 | A1 | 11/2005 | Valet |
| 2005/0269612 | A1 | 12/2005 | Torok |
| 2005/0275003 | A1 | 12/2005 | Shinmura |
| 2005/0282379 | A1 | 12/2005 | Saito |
| 2006/0049472 | A1 | 3/2006 | Diao |
| 2006/0060832 | A1 | 3/2006 | Symanczyk |
| 2006/0061919 | A1 | 3/2006 | Li |
| 2006/0083047 | A1 | 4/2006 | Fujita |
| 2006/0141640 | A1 | 6/2006 | Huai |
| 2006/0171199 | A1 | 8/2006 | Ju |
| 2006/0233017 | A1 | 10/2006 | Hosotani |
| 2006/0245117 | A1 | 11/2006 | Nowak |
| 2006/0281258 | A1 * | 12/2006 | Dieny et al. ............... 438/264 |
| 2007/0002504 | A1 | 1/2007 | Huai et al. |
| 2007/0007609 | A1 | 1/2007 | Saito |
| 2007/0008661 | A1 | 1/2007 | Min |
| 2007/0025164 | A1 | 2/2007 | Kim |
| 2007/0029630 | A1 | 2/2007 | Seyyedy |
| 2007/0035890 | A1 | 2/2007 | Sbiaa |
| 2007/0047294 | A1 | 3/2007 | Panchula |
| 2007/0054450 | A1 | 3/2007 | Hong |
| 2007/0063237 | A1 | 3/2007 | Huai |
| 2007/0064352 | A1 | 3/2007 | Gill |
| 2007/0069314 | A1 | 3/2007 | Wilson |
| 2007/0085068 | A1 | 4/2007 | Apalkov |
| 2007/0096229 | A1 | 5/2007 | Yoshikawa |
| 2007/0120210 | A1 | 5/2007 | Yuan |
| 2007/0132049 | A1 | 6/2007 | Stipe |
| 2007/0164380 | A1 | 7/2007 | Min |
| 2007/0171694 | A1 | 7/2007 | Huai |
| 2007/0230233 | A1 | 10/2007 | Takahashi |
| 2007/0241392 | A1 | 10/2007 | Lin |

| | | | |
|---|---|---|---|
| 2007/0246787 A1 | 10/2007 | Wang |
| 2007/0279968 A1 | 12/2007 | Luo |
| 2007/0297220 A1 | 12/2007 | Yoshikawa |
| 2007/0297223 A1 | 12/2007 | Chen |
| 2008/0026253 A1 | 1/2008 | Yuasa |
| 2008/0061388 A1 | 3/2008 | Diao |
| 2008/0130354 A1 | 6/2008 | Ho |
| 2008/0179699 A1 | 7/2008 | Horng |
| 2008/0191251 A1 | 8/2008 | Ranjan |
| 2008/0205121 A1 | 8/2008 | Chen |
| 2008/0258247 A1 | 10/2008 | Mancoff |
| 2008/0265347 A1 | 10/2008 | Iwayama |
| 2008/0273380 A1 | 11/2008 | Diao |
| 2008/0277703 A1 | 11/2008 | Iwayama |
| 2008/0291721 A1 | 11/2008 | Apalkov |
| 2008/0310213 A1 | 12/2008 | Chen |
| 2008/0310219 A1 | 12/2008 | Chen |
| 2009/0027810 A1 | 1/2009 | Horng |
| 2009/0040855 A1 | 2/2009 | Luo |
| 2009/0050991 A1 | 2/2009 | Nagai |
| 2009/0073756 A1 | 3/2009 | Yang |
| 2009/0185410 A1 | 7/2009 | Huai |
| 2009/0218645 A1 | 9/2009 | Ranjan |
| 2009/0257154 A1 | 10/2009 | Carey |
| 2009/0296454 A1 | 12/2009 | Honda |
| 2009/0302403 A1 | 12/2009 | Nguyen |
| 2010/0034009 A1 | 2/2010 | Lu |
| 2010/0118600 A1 | 5/2010 | Nagasi |
| 2010/0176471 A1 | 7/2010 | Zhu |

FOREIGN PATENT DOCUMENTS

| | | |
|---|---|---|
| WO | WO 2008/100868 | 8/2008 |

OTHER PUBLICATIONS

Berger, Emission of Spin Waves by Magnetic Multilayer Traversed by a Current, Physic. Review B 54, 9353 (1996).

Black et al., Programmable Logic Using Giant Magnetoresistance and Spin-Dependent Tunneling Devices (Invited), J. Appl. Phys. 87, 6674 (2000).

Chu et al., Fabrication of Ideally Ordered Nanoporous Alumina Films and Integrated Alumina Nanotubule Arrays by High-Field Anodization, Adv. Mater. 2005, 17, 2115-2119.

Cowburn et al., Room Temperature Magnetic Quantum Cellular Automata, Science 287, 1466 (2000).

de Groot et al., New Class of Materials: Half-Metallic Ferromagnets, Physics Review Letters, 50, 2024 (1983).

Egelhoff et al., Oxygen as a Surfactant in the Growth of Giant Magnetoresistance Spin Valves, Journal of Applied Physics 82 (12), Dec. 15, 1997.

Emley, N.C., et al., Reduction of Spin Transfer by Synthetic Antiferromagnets, Applied Physics Letters, May 24, 2004, pp. 4257-4259, vol. 84, No. 21.

Folk et al., A Gate-Controlled Bidirectional Spin Filter Using Quantum Coherence, Science, vol. 299, Jan. 31, 2003, pp. 679-682.

Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-L1060.

Huczko, Template-Based Synthesis of Nanomaterials, Appl. Phys. A 70, 365-376 (2000).

Kawahara et al., 2Mb Spin-Transfer Torque RAM (SPRAM) with Bit-by-Bit Bidirectional Current Write and Parallelizing-Direction Current Read, ISSCC 2007, Section 26, Non-Volatile Memories/26. 5.

Korenivski, et al., Thermally Activiated Switching in Spin-Flop Tunnel Junctions, Applied Physics Letters 86, 252506 (2005).

Li et al., Role of Oxygen Exposure in Different Positions in the Synthetic Spin Valves, Journal of Applied Physics, vol. 93, No. 10, May 15, 2003.

Macak et al., High-Aspect-Ratio TiO2, Nanotubes by Anodization of Titanium, Angew. Chem. Int. Ed. 2005, 44, 2100-2102.

Masuda and Kenji Fukuda, Science, 268, 1466 91995).

Masuda et al., Ordered Metal Nanohole Arrays Made by a Two-Step Replication of Honeycomb Structures of Anodic Alumina, Science, OI. 268, Jun. 9, 1995.

Meng et al., A Spintronics Full Adder for Magnetic CPU, IEEE Elec. Dev. Lett. 26, 360 (2005).

Meng et al., Spin Transfer in Nanomagnetic Devices with Perpendicular Anistropy, Applied Physics Letters 88, 172506 (2006).

Miura et al., A Novel SPRAM (Spin Transfer Torque RAM) with a Synthetic Ferrimagnetic Free Layer . . . , VLSI Symposium on VLSI Tech. Digest of Technical Papers (2007).

Ney et al., Programmable Computing with a Single Magnetoresistance Element, Nature 425, 485 (2003).

PCT Search Report and Written Opinion dated Oct. 4, 2010.

PCT Search Report and Written Opinion dated Mar. 10, 2010.

PCT Search Report and Written Opinion dated Mar. 22, 2010.

Seki et al., Spin-Polarized Current-Induced Magnetization Reversal in Perpendicularly Magnetized L1o-FePt Layers, Applied Physics Letters 88, 172504 (2006).

Sharrock, Time Dependence of Switching Fields in Magnetic Recording Media (Invited), J. Appl. Phys. 76 (10), Nov. 15, 1994.

Slonczewski et al., Current-Driven Excitation of Magnetic Multilayers, Journal of Magnetism and Magnetic Materials 159 (1996) L1-L7.

Sun, "Spin-Current Interaction with a Monodomain Magnetic Body: A Model Study", Physical Review B, vol. 62, No. 1, (2000), pp. 570-578.

Sun, Current-Driven Magnetic Switching in Manganite Trilayer Junctions, Journal of Magnetism and Magnetic Materials 202 (1999) 157-162.

Thurn-Albrecht et al., Science, 290, 2126 (2000).

U.S. Appl. No. 12/416,976, filed Apr. 2, 2009, Inventor: Zheng.

U.S. Appl. No. 12/106,382, filed Apr. 21, 2008, Inventors: Xi et al.

U.S. Appl. No. 12/125,975, filed May 23, 2008, Inventor: Xi.

U.S. Appl. No. 12/126,014, filed May 23, 2008, Inventor: Xiaohua Lou.

U.S. Appl. No. 12/170,519, filed Jul. 10, 2008, Inventors: Xi et al.

U.S. Appl. No. 12/175,545, filed Jul. 18, 2008, Inventor: Lou.

U.S. Appl. No. 12/239,882, filed Sep. 29, 2008, Inventor: Zheng et al.

U.S. Appl. No. 12/239,887, filed Sep. 29, 2008; Inventor: Zheng.

U.S. Appl. No. 12/258,476, filed Oct. 27, 2008, Inventor: Lou.

U.S. Appl. No. 12/258,491, filed Oct. 27, 2008, Inventor: Lou.

U.S. Appl. No. 12/258,492, filed Oct. 27, 2008, Inventor: Lou.

U.S. Appl. No. 12/269,507, filed Nov. 12, 2008, Inventor: Tian.

U.S. Appl. No. 12/269,514, filed Nov. 12, 2008, Inventor: Venkatasamy.

U.S. Appl. No. 12/269,537, filed Nov. 12, 2008, Inventor: Tang et al.

U.S. Appl. No. 12/396,905, filed Mar. 3, 2009, Inventor: Gao.

U.S. Appl. No. 12/398,214, filed Mar. 5, 2009, Inventor: Wang et al.

U.S. Appl. No. 12/425,457, filed Apr. 17, 2009, Inventor: Gao.

Vurgaftman et al., Spin-Polarizing Properties of the InAs/(AlSb)/GaMnSb/(AlSb/InAs Ferromagnetic Resonant Interband Tunneling Diode, Physical Review B 67, 12509 (2003).

Wendt et al., Electronic and Vibrational Properties of Ultrathin SiO2 Films Grown on Mo(112), 2005, Phys. Rev. vol. B72, pp. 1150409-1-115409.0.

Yan et al., Magnesium Oxide as a Candidate High-k Gate Dielelectric, 2006, Applied Physics Lett. vol. 88, pp. 142901-1-142901-3.

Yen et al., Reduction in Critical Current Density for Spin Torque Transfer Switching with Composite Free Layer, Applied Physics Letters 93, 092504 (2008).

Zheng et al., Low Switching Current Flux-Closed Magnetoresistive Random Access Memory, Journal of Applied Physics, May 15, 2003.

Zheng et al., Magnetic Random Access Memory (MRAM), Journal of Nanoscience and Nanotechnology, vol. 7, 117-137 (2007).

Zhuang et al., Tech Dig. IEDM (2002) 193.

Sun, J.Z., Spin Angular Momentum Transfer in Current-Perpendicular Nanomagnetic Junctions, IBM J. Res & Dev., vol. 50, No. 1, Jan. 2006, pp. 81-100.

I L Prejbeanu et al., Thermally Assisted MRAM, J. Phys. Condens. Matter 19 (2007) 165218 (23 pp).

* cited by examiner

US 8,089,132 B2

MAGNETIC MEMORY WITH PHONON GLASS ELECTRON CRYSTAL MATERIAL

RELATED APPLICATIONS

This application claims priority to U.S. provisional patent application No. 61/104,078, filed on Nov. 18, 2008 and titled "Thermally Assistant MRAM and RRAM with Peltier Effect". The entire disclosure of application No. 61/104,078 is incorporated herein by reference.

BACKGROUND

Magnetic random access memory (MRAM) devices are solid state, non-volatile memory devices which make use of the giant magnetoresistive effect. A conventional MRAM device includes a column of first electrical wires, referred to as word lines, and a row of second electrical wires, referred to as bit lines. An array of magnetic memory cells, located at the junctions of the word lines and bit lines, is used to record data signals.

A magnetic memory cell includes a hard magnetic layer, a soft magnetic layer, and a non-magnetic layer sandwiched between the hard magnetic layer and the soft magnetic layer. The hard magnetic layer has a magnetization vector or orientation fixed in one direction. The orientation of this magnetization vector does not change under a magnetic field or electron spin-torque applied thereon. The soft magnetic layer has an alterable magnetization vector or orientation under a magnetic field applied thereon, that either points to the same direction, hereinafter "parallel alignment", or to the opposite direction, hereinafter "antiparallel alignment", of the magnetization vector or orientation of the hard magnetic layer. Since the resistances of the magnetic memory cell in the "parallel alignment" status and the "antiparallel alignment" status are different, the two types of alignment status can be used to record the two logical states—the "0"s or "1"s of a data bit.

In a writing operation for one illustrative embodiment, an electric current passes through the word line and the bit line adjacent to the memory cell. When the electric current reaches a certain threshold, a magnetic field generated by the electric current will switch the orientation of the magnetization vector of the soft magnetic layer. As a result, the magnetization vector of the hard magnetic layer and the soft magnetic layer will be changed from one type of alignment, e.g. "parallel alignment", to the other type of alignment, e.g. "antiparallel alignment", so that a data signal in form of one data bit can be recorded in the memory cell.

In MRAM structure design, lower writing power dissipation and a higher cell density are desired. Unfortunately, a reduction of cell size, i.e. an increase in cell density, leads to a reduction in the available energy ($K_u V$) to store the bit data. Further, the error rate increases as the cell size scales down. In order to reduce the error rate, high anisotropy energy is required to overcome thermal fluctuations. Hard magnetic material has higher anisotropy energy compared with soft magnetic material, but in that case a higher writing current is required. The higher anisotropy energy results in higher writing current density, which unfortunately has the disadvantage of electro-migration.

In order to reduce the writing current for a high coercivity MRAM, thermally assisted MRAMs are disclosed. Un-pinned ferromagnetic materials, in which the coercivity decreases sharply as temperature increases, are used for the recording layer in the MRAMs.

Another type of MRAM is spin-transfer torque memory (STRAM). STRAM utilizes electron spin torque to switch the free layer by passing a spin polarized current thorough the STRAM. STRAM has a higher efficiency as the memory cells scale down, but still suffers from the same issues as other MRAM cells as STRAM scales down. STRAM can also utilize thermal assist concept to reduce the switching current and maintain data retention time.

However, thermally assisted MRAM suffer from low heating efficiency. In addition, due to Joule heating, heat gradually builds in the memory array structure which increases the temperature of the memory device during operation.

BRIEF SUMMARY

The present disclosure relates to thermally assisted MRAM that includes phonon glass electron crystal material. In particular, the present disclosure relates to thermally assisted MRAM that utilize phonon glass electron crystal material to confine heat within the MRAM. The present disclosure relates to thermally assisted MRAM that utilize two different materials that generate a Peltier effect that assists in heating and cooling the MRAM cell.

One illustrative magnetic memory unit includes a tunneling barrier separating a free magnetic element and a reference magnetic element. A first phonon glass electron crystal layer is disposed on a side opposing the tunneling barrier of either the free magnetic element or the reference magnetic element.

One illustrative method includes applying a first current through a magnetic memory unit in a first direction. The magnetic memory unit includes a magnetic tunnel junction separating a first phonon glass electron crystal layer and a second phonon glass electron crystal layer. The first current causing a first interface between the magnetic tunnel junction and the first phonon glass electron crystal layer and a second interface between the magnetic tunnel junction and the second phonon glass electron crystal layer to generate heat. The method then includes applying a second current through the magnetic memory unit in a second direction opposing the first direction. The second current causing the first interface and the second interface to absorb heat.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to thermally assisted MRAM that includes phonon glass electron crystal material. In particular, the present disclosure relates to thermally assisted MRAM that utilize phonon glass electron crystal material to confine heat within the MRAM. The present disclosure relates to thermally assisted MRAM that utilize two different materials that generate a Peltier effect that assists in heating and cooling the MRAM cell While the present disclosure is not so limited, an appreciation of various aspects of the disclosure will be gained through a discussion of the examples provided below.

Figure 1:
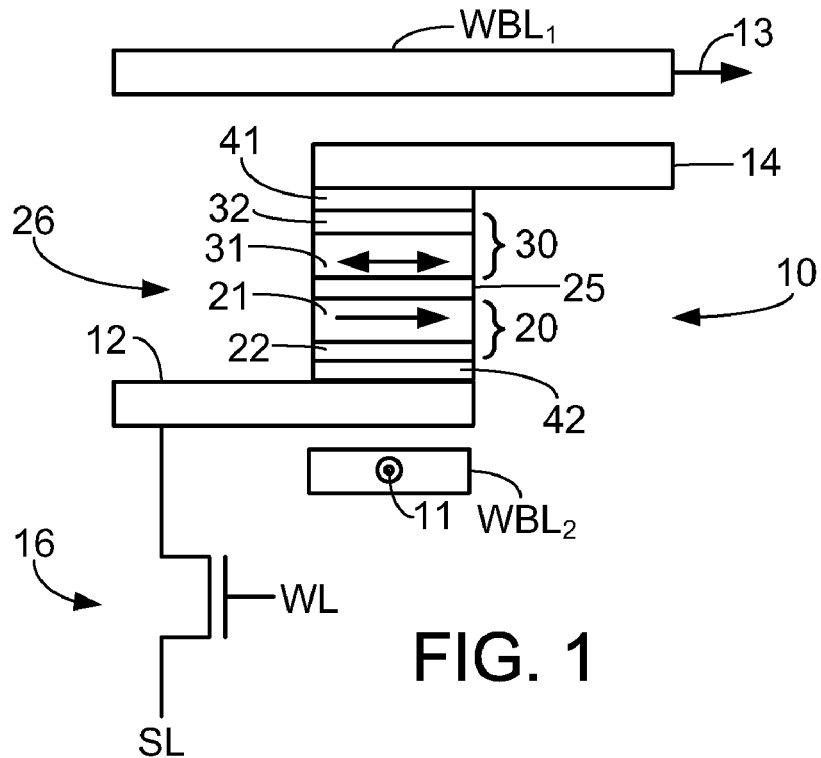
FIG. 1 is a schematic side view of an exemplary MRAM memory unit that utilizes external magnetic fields.
Figure 2:
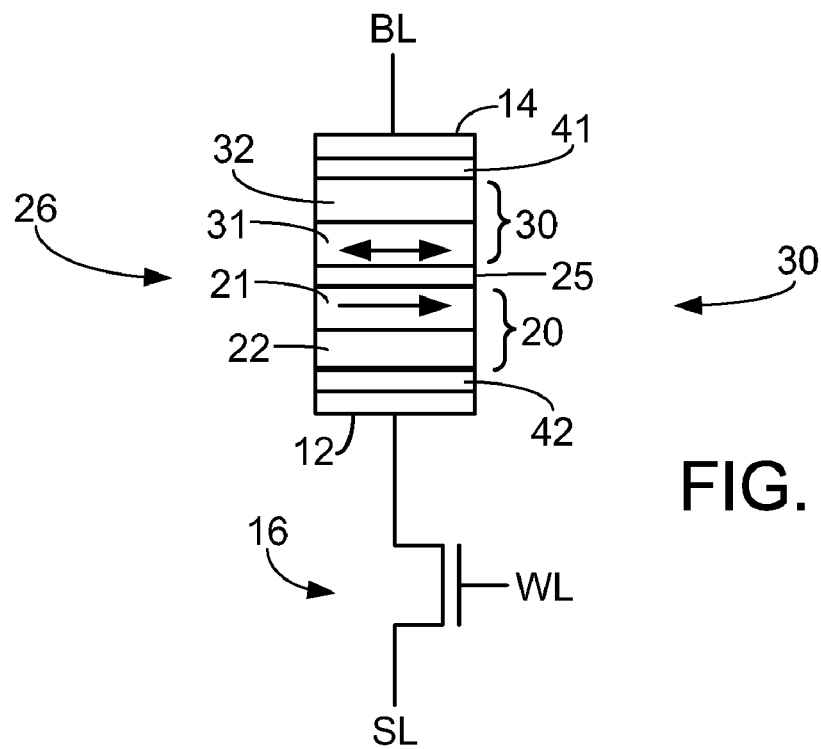
FIG. 2 is a schematic side view of another exemplary MRAM memory unit that utilizes spin-torque transfer.

FIG. 1 is a schematic side view of an exemplary magnetic memory (MRAM) unit 10 and FIG. 2 is a schematic side view of an exemplary MRAM unit 30. The MRAM memory unit 10 includes a reference magnetic element 20, a free magnetic element 30 and a tunneling barrier 25 separating the reference magnetic element 20 from the free magnetic element 30. These elements or layers are disposed electrically between a first electrode 12 and a second electrode 14 forming a magnetic tunnel junction 26. While a single MRAM memory unit 10 is shown, it is understood that a plurality of MRAM memory units 10 can be arranged in an array to form a memory array.

An access transistor 16 is electrically connected to the first electrode 12. The access or select transistor 16 can be electrically coupled to a sourceline SL and a wordline WL, for example. The access transistor 16 can be any useful transistor such as, for example, a NMOS or PMOS device. The access transistor 16 can provide a reading current, a cooling current, and a heating current to the magnetic tunnel junction 26.

The reference magnetic element 20 can include, at least, a reference ferromagnetic layer 21 and a reference antiferromagnetic layer 22. The reference antiferromagnetic layer 22 serves to fix the magnetization of the reference ferromagnetic layer 21. The reference magnetic element 20 has a blocking temperature (i.e., critical temperature) that is substantially the Curie temperature of the reference magnetic element 20. The blocking temperature of the reference antiferromagnetic layer 22 is the temperature at or above which the reference antiferromagnetic layer 22 loses its ability to pin (i.e., fix) the magnetization orientation of the adjacent reference ferromagnetic layer 21. In many embodiments, the blocking temperature is above 250 degrees centigrade or in a range from 200 to 350 degrees centigrade. In some embodiments, the reference magnetic element 20 includes more than one ferromagnetic layer that are coupled anti-ferromagnetically to each other (e.g., synthetic antiferromagnet). The synthetic antiferromagnet structure of the reference magnetic element 20 can reduce stray magnetic field interactions with the free magnetic element 30. The reference ferromagnetic layer 21 can be formed of any useful material such as, for example, alloys and materials including Co, Fe, and/or Ni. The reference antiferromagnetic layer 22 can be formed of any useful material such as, for example, IrMn, FeMn, and/or PtMn.

The free magnetic element 30 can include, at least, a free ferromagnetic layer 31 and a free antiferromagnetic layer 32. The free antiferromagnetic layer 32 serves to fix the magnetization of the free ferromagnetic layer 31. The free magnetic element 30 has a blocking temperature (i.e., critical temperature) that is substantially the Curie temperature of the free magnetic element 30. The blocking temperature of the free antiferromagnetic layer 32 is the temperature at or above which the free antiferromagnetic layer 32 loses its ability to pin (i.e., fix) the magnetization orientation of the adjacent free ferromagnetic layer 31. In many embodiments, the blocking temperature of the free antiferromagnetic layer 32 is less than the blocking temperature of the reference antiferromagnetic layer 22. In many embodiments, the blocking temperature of the free antiferromagnetic layer 32 is less than 150 degrees centigrade or in a range from 50 to 150 degrees centigrade. In some embodiments, the free magnetic element 30 includes more than one ferromagnetic layer that are coupled anti-ferromagnetically to each other (e.g., synthetic antiferromagnet). The synthetic antiferromagnet structure of the free magnetic element 30 can reduce stray magnetic field interactions with the reference magnetic element 20. The free ferromagnetic layer 31 can be formed of any useful material such as, for example, alloys and materials including Co, Fe, and/or Ni. The free antiferromagnetic layer 32 can be formed of any useful material such as, for example, IrMn, FeMn, and/or PtMn.

The tunneling barrier 25 separates the free magnetic element 30 from the reference magnetic element 20. The tunneling barrier 25 is an electrically insulating and non-magnetic material. The tunneling barrier 25 can be formed of any useful electrically insulating and non-magnetic material such as, AlO, MgO, and/or TiO, for example.

The magnetic memory unit 10 includes phonon glass electron crystal layers 41, 42 disposed adjacent to the free magnetic element 30 or the reference magnetic element 20. In the illustrated embodiment, a first phonon glass electron crystal layer 41 is adjacent to free magnetic element 30 and a second phonon glass electron crystal layer 42 is adjacent to the reference magnetic element 20. In many embodiments, the first phonon glass electron crystal layer 41 separates the free magnetic element 30 from the second electrode 14 and the second phonon glass electron crystal layer 42 separates the reference magnetic element 20 from the reference magnetic element 20.

The phonon glass electron crystal material forming the layer 41, 42 is electrically conducting but thermally insulating. In other words, phonon glass electron crystal material possesses good electronic transport properties of a crystal and resists the passage of heat as well as glass does. For example, the phonon glass electron crystal material forming the layer 41, 42 has a thermal conductivity of less than 10 W/m-K and an electrical area resistance of less than 100 Ohm/$\mu m^2$. Thus, the phonon glass electron crystal material reduces or prevent heat from passing through the phonon glass electron crystal material. This can increase energy efficiency when heating the magnetic memory cell for thermally assisted writing operations.

The phonon glass electron crystal layer can be formed of any useful material possessing the electrically conducting but thermally insulating properties described above. In many embodiments, the phonon glass electron crystal layer is a superlattice structure formed of an alloy of BiTeSe, CoAs, CeCoFeSb, SiGeC/Si, $Bi_2Te_3/Sb_2Te_3$ or $X_8Y_{16}Z_{30}$ where X is Ba, Sr, or Eu; Y is Al, Ga or In; and Y is Si, Ge or Sn.

In many embodiments, the phonon glass electron crystal layer provides a Peltier effect on the magnetic tunnel junction when a current flows through the memory unit. When a current passes through the memory unit having an n type phonon glass electron crystal layer and an opposing p type phonon glass electron crystal layer sandwiching the magnetic tunnel junction, the current causes the interfaces between the magnetic tunnel junction and the phonon glass electron crystal layers to either generate heat or absorb heat, depending on the direction of the current.

For example, when applying a first current through a magnetic memory unit in a first direction, where the magnetic memory unit includes a magnetic tunnel junction separating a first phonon glass electron crystal layer and a second phonon glass electron crystal layer, the first current causes an interface between the magnetic tunnel junction and the first phonon glass electron crystal layer and the second phonon glass electron crystal layer to generate heat. Electrons in an n type phonon glass electron crystal layer will move opposite the direction of the current and holes in the p type phonon glass electron crystal layer will move in the direction of the current, both removing heat from one side of the magnetic tunnel junction.

Likewise, when applying a second current through the magnetic memory unit in a second direction opposing the first direction, the second current causes an interface between the magnetic tunnel junction and the first phonon glass electron crystal layer and the second phonon glass electron crystal layer to absorb heat. P type silicon has a positive Peltier coefficient and n type silicon has a negative Peltier coefficient.

N type (n for negative) dopants for semiconductor substrates (e.g., phonon glass electron crystal material) include, phosphorus (P), arsenic (As), or antimony (Sb), boron (B) or aluminum (Al), for example. P type (P for positive) dopants are a certain type of atoms added to the semiconductor substrates (e.g., phonon glass electron crystal material) in order to increase the number of free charge carriers (in this case positive).

When the doping material is added to the semiconductor substrates (e.g., phonon glass electron crystal material), it takes away (accepts) weakly-bound outer electrons from the semiconductor atoms. This type of doping agent is also known as acceptor material and the semiconductor atoms that have lost an electron are known as holes.

The purpose of p type doping is to create an abundance of holes. In the case of silicon, a trivalent atom (often from group IIIA of the periodic table, such as boron or aluminum) is substituted into the crystal lattice. The result is that one electron is missing from one of the four covalent bonds normal for the silicon lattice. Thus the dopant atom can accept an electron from a neighboring atoms' covalent bond to complete the fourth bond. Such dopants are called acceptors. The dopant atom accepts an electron, causing the loss of half of one bond from the neighboring atom and resulting in the formation of a "hole". Each hole is associated with a nearby negative-charged dopant ion, and the semiconductor remains electrically neutral as a whole. However, once each hole has wandered away into the lattice, one proton in the atom at the hole's location will be "exposed" and no longer cancelled by an electron. For this reason a hole behaves as a quantity of positive charge. When a sufficiently large number of acceptor atoms are added, the holes greatly outnumber the thermally-excited electrons. Thus, the holes are the majority carriers, while electrons are the minority carriers in p type materials.

An n type semiconductor (including phonon glass electron crystal material) is obtained by carrying out a process of doping, that is, by adding an impurity of valence-five elements to a valence-four semiconductor in order to increase the number of free charge carriers (in this case negative). When the doping material is added, it gives away (donates) weakly-bound outer electrons to the semiconductor atoms. This type of doping agent is also known as donor material since it gives away some of its electrons.

The purpose of n type doping is to produce an abundance of mobile or "carrier" electrons in the material. To help understand how n type doping is accomplished, consider the case of silicon (Si). Si atoms have four valence electrons, each of which is covalently bonded with each of the four adjacent Si atoms. If an atom with five valence electrons, such as those from group 15 (old group VA, a.k.a. nitrogen group) of the periodic table (e.g., phosphorus (P), arsenic (As), or antimony (Sb)), is incorporated into the crystal lattice in place of a Si atom, then that atom will have four covalent bonds and one unbonded electron. This extra electron is only weakly bound to the atom and can easily be excited into the conduction band. At normal temperatures, virtually all such electrons are excited into the conduction band. Since excitation of these electrons does not result in the formation of a hole, the number of electrons in such a material far exceeds the number of holes. In this case the electrons are the majority carriers and the holes are the minority carriers. Because the five-electron atoms have an extra electron to "donate", they are called donor atoms. Note that each movable electron within the semiconductor (e.g., phonon glass electron crystal material) is not far from an immobile positive dopant ion, and the n doped material normally has a net electric charge of zero. In an n type semiconductor, the fermi level lies closer to the conduction band edge.

The magnetic memory cell 10, 30 is in the low resistance state when the magnetization orientation of the free magnetic layer 31 is parallel and in the same direction of the magnetization orientation of the reference magnetic layer 21. This is termed the low resistance state or "0" data state. The magnetic memory cell 10, 30 is in the high resistance state when the magnetization orientation of the free magnetic layer 31 is anti-parallel and in the opposite direction of the magnetization orientation of the reference magnetic layer 21. This is termed the high resistance state or "1" data state.

FIG. 1 is a schematic side view of an exemplary MRAM memory unit 10 that utilize external magnetic fields to switch the data state of the memory unit. The free magnetic element 30 has a magnetization orientation that is alterable or rotatable upon application of an external magnetic field (such as is produced by the first writing bit line $WBL_1$ and the second writing bit line $WBL_2$). A first writing bit line $WBL_1$ is electrically isolated from the memory stack 26 and passes close enough to the memory stack 26 so that its magnetic field generated by a current 13 passing thought the first writing bit line $WBL_1$ can alter the magnetization orientations of the recording magnetic layer 20 and/or the free magnetic layer 30. The first writing bit line $WBL_1$ longitudinally extends in a first direction.

A second writing bit line WBL$_2$ is electrically isolated from the memory stack 26 and passes close enough to the memory stack 26 so that its magnetic field generated by a current 11 passing thought the second writing bit line WBL$_2$ can alter the magnetization orientations of the recording magnetic layer 20 and the free magnetic layer 30. The second writing bit line WBL$_2$ longitudinally extends in a second direction and in many embodiments is orthogonal to the first direction.

FIG. 2 is a schematic side view of another exemplary MRAM memory unit 30 that utilize spin-torque transfer to switch the data state of the memory unit. Switching the resistance state (between a high and low resistance state) and hence the data state of the memory unit 30 via spin-transfer occurs when a current, passing through a magnetic layer of the memory unit 30, becomes spin polarized and imparts a spin torque on the free magnetic element 30 of the magnetic tunnel junction 26. When a sufficient spin torque is applied to the free magnetic element 30, the magnetization orientation of the free magnetic element 30 can be switched between two opposite directions and accordingly the magnetic memory cell 30 can be switched between the parallel state (i.e., low resistance state or "0" data state) and anti-parallel state (i.e., high resistance state or "1" data state) depending on the direction of the current.

Figure 3:
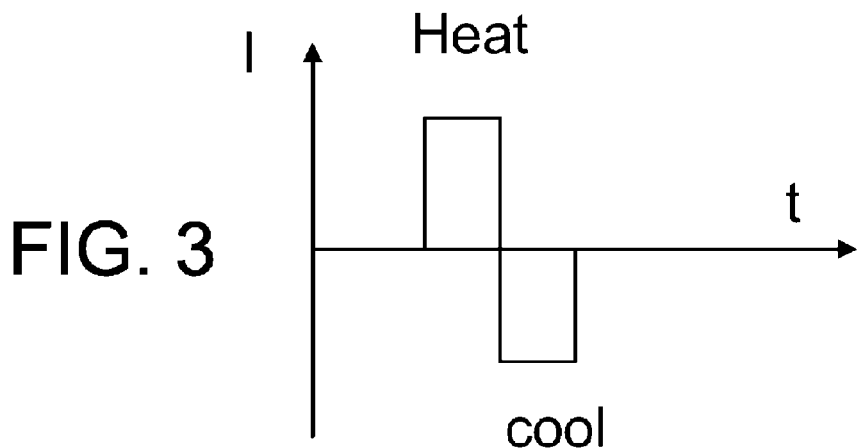
FIG. 3 is a graph of current verses time for an exemplary MRAM memory unit.

FIG. 3 is a graph of current verses time for an exemplary MRAM memory unit. For example, a positive current flowing through the magnetic memory units, described above heats the magnetic tunnel junction 26 and a negative current flowing through the magnetic memory units, described above cools the magnetic tunnel junction 26. Thus, these magnetic memory configurations can be utilized with thermally assisted magnetic memory where the magnetic memory is heated to a temperature that reduces the switching field or current needed to switch the memory unit between the high and low resistance state. Then passing a current in the opposing direction removes heat from the magnetic tunnel junction and provides an expedited cool down of the magnetic tunnel junction.

Figure 4:
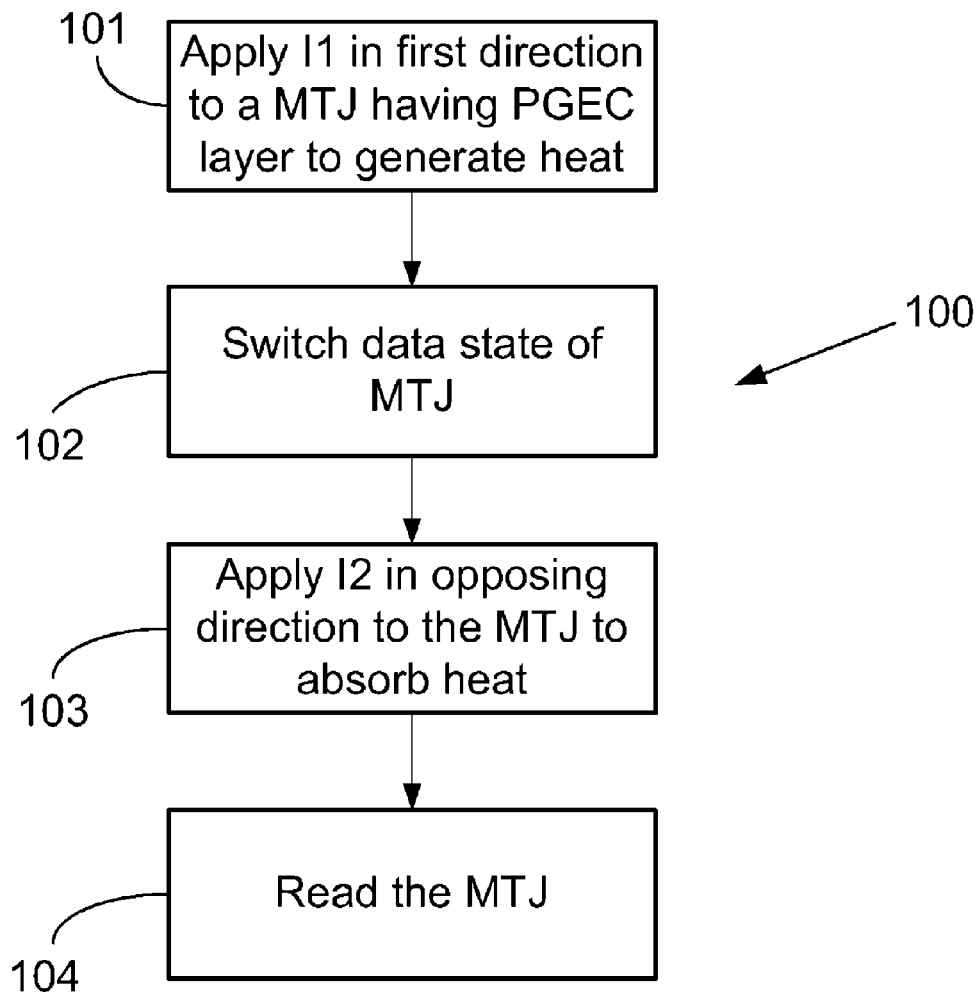
FIG. 4 is a flow diagram of an illustrative method.

FIG. 4 is a flow diagram of an illustrative method 100. The method includes applying a first current I1 in a first direction through a magnetic tunnel junction (MTJ) having a phonon glass electron crystal layer (PGEC) to generate heat at block 101 The first current can be sufficient to raise the temperature of a antiferromagnetic layer adjacent to the free magnetic layer above it blocking temperature. This reduces the electric field needed to switch the magnetization orientation of the free magnetic layer at block 102. The phonon glass electron crystal layer also improves the heating efficiency for the MTJ by confining the generated heat to the MTJ. Then the MTJ can be cooled down by applying a second current I2 in a second direction (opposing the first direction) through a magnetic tunnel junction (MTJ) to absorb heat at block 103. This active cool down increases the heat removal from the MTJ (since the phonon glass electron crystal layer reduces or prevents heat flow through the phonon glass electron crystal layer) reducing the write time and allows the read operation to proceed at block 104 when the MTJ is cooled down sufficiently.

Thus, embodiments of the MAGNETIC MEMORY WITH PHONON GLASS ELECTRON CRYSTAL MATERIAL are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic memory unit, comprising:
   a tunneling barrier separating a free magnetic element and a reference magnetic element forming a magnetic tunnel junction; and
   a first phonon glass electron crystal layer disposed on a side opposing the tunneling barrier of either the free magnetic element or the reference magnetic element;
   wherein the magnetic tunnel junction switches between a high resistance data state and a low resistance data state by passing a spin-polarized current though the magnetic tunnel junction.

2. A magnetic memory unit according to claim 1, further comprising a second phonon glass electron crystal layer, wherein the first phonon glass electron crystal layer is disposed on the side opposing the tunneling barrier of the free magnetic layer, and the second phonon glass electron crystal layer is disposed on the side opposing the tunneling barrier of the reference magnetic layer.

3. A magnetic memory unit according to claim 2, wherein the phonon glass electron crystal layers provide a Peltier effect on the magnetic tunnel junction when current flows through the magnetic memory unit.

4. A magnetic memory unit according to claim 1, wherein the phonon glass electron crystal layer has a thermal conductivity of less than 10 W/mK and an electrical area resistance of less than 100 Ohm/μm$^2$.

5. A magnetic memory unit according to claim 1, wherein the phonon glass electron crystal layer comprises an alloy of BiTeSe, CoAs, CeCoFeSb, SiGeC/Si, Bi$_2$Te$_3$/Sb$_2$Te$_3$ or X$_8$Y$_{16}$Z$_{30}$ where X is Ba, Sr, or Eu, Y is Al, Ga or In, and Z is Si, Ge or Sn.

6. A magnetic memory unit according to claim 1, wherein the reference magnetic element comprises a reference ferromagnetic layer and a reference antiferromagnetic layer having a reference blocking temperature, and the free magnetic element comprises a free ferromagnetic layer and a free antiferromagnetic layer having a free blocking temperature being less than the reference blocking temperature.

7. A memory unit, comprising:
   a tunneling barrier separating a free magnetic element and a reference magnetic element forming a magnetic tunnel junction;
   a first phonon glass electron crystal layer disposed adjacent to the free magnetic element;
   a second phonon glass electron crystal layer disposed adjacent to the reference magnetic element, wherein the first phonon glass electron crystal layer and the second phonon glass electron crystal layer are formed of different materials; and
   a first electrode is electrically coupled to the first phonon glass electron crystal layer and a second electrode is electrically coupled to the second phonon glass electron crystal layer.

8. A memory unit according to claim 7, wherein the first and second phonon glass electron crystal layers have a thermal conductivity of less than 10 W/mK and an electrical area resistance of less than 100 Ohm/μm$^2$.

9. A memory unit according to claim 7, wherein the magnetic tunnel junction switches between a high resistance data state and a low resistance data state by passing a spin-polarized current though the magnetic tunnel junction.

10. A memory unit according to claim 7, wherein the magnetic tunnel junction switches between a high resistance data state and a low resistance data state by applying an external magnetic field though the magnetic tunnel junction.

11. A memory unit according to claim 7, wherein the first and second phonon glass electron crystal layers each independently comprises BiTeSe, CoAs, CeCoFeSb, SiGeC/Si, $Bi_2Te_3/Sb_2Te_3$ or $X_8Y_{16}Z_{30}$ where X is Ba, Sr, or Eu, Y is Al, Ga or In, and Z is Si, Ge or Sn.

12. A memory unit according to claim 7, wherein the reference magnetic element comprises a reference ferromagnetic layer and a reference antiferromagnetic layer having a reference blocking temperature, and the free magnetic element comprises a free ferromagnetic layer and a free antiferromagnetic layer having a free blocking temperature being less than the reference blocking temperature.

13. A memory unit according to claim 7, wherein the first phonon glass electron crystal layer is formed of a p type semiconductor material and the second phonon glass electron crystal layer is formed of an n type semiconductor material.

14. A memory unit according to claim 7, wherein the first phonon glass electron crystal layer is formed of an n type semiconductor material and the second phonon glass electron crystal layer is formed of a p type semiconductor material.

15. An article, comprising:
   a tunneling barrier separating a free magnetic element and a reference magnetic element forming a magnetic tunnel junction; and
   a first phonon glass electron crystal layer disposed on a side opposing the tunneling barrier of either the free magnetic element or the reference magnetic element;
   wherein the magnetic tunnel junction switches between a high resistance data state and a low resistance data state by passing a spin-polarized current though the magnetic tunnel junction.

16. An article according to claim 15, further comprising a second phonon glass electron crystal layer, wherein the first phonon glass electron crystal layer is disposed on the side opposing the tunneling barrier of the free magnetic layer, and the second phonon glass electron crystal layer is disposed on the side opposing the tunneling barrier of the reference magnetic layer.

17. An article according to claim 15, wherein the phonon glass electron crystal layer has a thermal conductivity of less than 10 W/mK and an electrical area resistance of less than 100 Ohm/μm².

18. An article according to claim 15, wherein the phonon glass electron crystal layer comprises an alloy of BiTeSe, CoAs, CeCoFeSb, SiGeC/Si, $Bi_2Te_3/Sb_2Te_3$ or $X_8Y_{16}Z_{30}$ where X is Ba, Sr, or Eu, Y is Al, Ga or In, and Z is Si, Ge or Sn.

19. An article according to claim 15, wherein the reference magnetic element comprises a reference ferromagnetic layer and a reference antiferromagnetic layer having a reference blocking temperature, and the free magnetic element comprises a free ferromagnetic layer and a free antiferromagnetic layer having a free blocking temperature being less than the reference blocking temperature.

* * * * *